United States Patent [19]
Walley

[11] Patent Number: 5,828,692
[45] Date of Patent: Oct. 27, 1998

[54] BASEBAND DEMODULATOR FOR POLAR OR RECTANGULAR MODULATED SIGNAL IN A CORDLESS SPREAD SPECTRUM TELEPHONE

[75] Inventor: John S. Walley, Lake Forest, Calif.

[73] Assignee: Rockwell International Corporation, Newport Beach, Calif.

[21] Appl. No.: 568,045

[22] Filed: Dec. 6, 1995

[51] Int. Cl.[6] .............................. H04B 1/69; H04B 1/16; H04L 27/00

[52] U.S. Cl. ..................... 375/200; 375/324; 375/345; 455/245.1

[58] Field of Search .................................. 375/316, 322, 375/324, 345, 200, 329, 330; 455/144, 234.1, 239.1, 245.1

[56] References Cited

U.S. PATENT DOCUMENTS

| | | | |
|---|---|---|---|
| 4,481,640 | 11/1984 | Chow et al. ................................ | 375/1 |
| 4,703,282 | 10/1987 | Yoshida .................................... | 375/324 |
| 4,724,435 | 2/1988 | Moses et al. ............................ | 340/870 |
| 4,804,938 | 2/1989 | Rouse et al. ............................ | 340/310 |
| 4,972,430 | 11/1990 | Cantwell ................................ | 375/200 |
| 5,042,050 | 8/1991 | Owen ..................................... | 375/1 |
| 5,077,753 | 12/1991 | Grau, Jr. et al. ........................ | 375/1 |
| 5,103,459 | 4/1992 | Gilhousen et al. ....................... | 375/1 |
| 5,150,377 | 9/1992 | Vannucci ................................. | 375/1 |
| 5,280,472 | 1/1994 | Gilhousen ............................... | 370/18 |
| 5,309,474 | 5/1994 | Gilhousen et al. ....................... | 375/1 |
| 5,351,270 | 9/1994 | Graham et al. .......................... | 375/1 |
| 5,375,140 | 12/1994 | Bustamante et al. .................... | 375/1 |
| 5,416,797 | 5/1995 | Gilhousen et al. ...................... | 375/205 |
| 5,579,319 | 11/1996 | Daniel .................................... | 455/234.1 |
| 5,598,438 | 1/1997 | Lepping ................................. | 375/324 |

*Primary Examiner*—Stephen Chin
*Assistant Examiner*—Jeffrey W. Gluck
*Attorney, Agent, or Firm*—James P. O'Shaughnessy; William C. Cray

[57] ABSTRACT

A cordless telephone system connectable to the public switched telephone network having a base station and one or more handsets communicating with the base station by an RF link utilizing a DBPSK I and Q demodulator with a digital AGC loop. When $R \angle \theta$ is being received instead of I and Q data, the phase information ($\angle \theta$) is connected to the I input of the DBPSK demodulator. The amplitude information (R) and the output of the digital AGC logic are applied as differential inputs to the Q input of the DBPSK demodulator. The I input to the AGC logic is set to zero. The Q input to the AGC logic is supplied with the R data. The AGC servo loop with the differential Q inputs to the DBPSK demodulator creates a high resolution A/D converter for R. The theta information is used to demodulate the incoming bipolar data, which may be either MSK or FSK, if a limiter-discriminator or other FM demodulator is used.

10 Claims, 3 Drawing Sheets

5,828,692

BASEBAND DEMODULATOR FOR POLAR OR RECTANGULAR MODULATED SIGNAL IN A CORDLESS SPREAD SPECTRUM TELEPHONE

BACKGROUND OF THE INVENTION

1. Field of the Invention

The present invention relates generally to improvements in digital telephones and, more particularly, pertains to new and improved baseband demodulation circuits for cordless spread spectrum telephones.

2. Description of Related Art

The cordless telephone products that exist today for the most part use analog frequency modulation in the 46–49 MHz band, and provide good speech quality when the handset is at close proximity to the base station. Although these analog cordless telephones are inexpensive and offer advantages to the customer which have made the products a successful replacement for corded telephones, these analog telephones still leave much room for improvement. For example, it would be desirable to have a longer handset-to-base station range without dropouts, more channels, and greater security.

Use of digital modulation and digital coding techniques offers more robust voice communication over a radio channel, although requiring greater channel bandwidth. Digital modulation also has a capture effect that greatly surpasses co-channel and adjacent channel interference, thereby providing a more noise-free conversation. Use of digital modulation encoding also allows for the addition of effective scrambling codes to thereby greatly improve telephone security. In addition, by utilizing the industrial, medical, and scientific (ISM) band for radio transmission and reception (902–920 MHz), increased power levels above those in the 46–49 MHz band are permitted, thus increasing the operating range. A requirement of using the highest power level in the ISM band is that direct sequence spread spectrum (DSSS) or frequency-hopped spread spectrum (FHSS) modulation be utilized.

There are at least two types of radios used today with direct-sequence spread spectrum systems. One uses AM modulation and complex I, Q demodulation of the baseband direct sequence spread spectrum signal. The other uses FM modulation and limiter-discriminator R $\angle\theta$ demodulation of the baseband direct sequence spread spectrum signal.

In order to accommodate both a polar (R $\angle\theta$) and a rectangular (I & Q) radio frequency modem, two separate baseband demodulators normally had to be used. The present invention utilizes only one demodulator for both.

SUMMARY OF THE INVENTION

The demodulation of both polar and rectangular modulated signals is accomplished by using a complex binary shift keyed receiver with a digital AGC loop. The receiver is normally used to demodulate a rectangular modulated signal (I & Q) into I and Q baseband data. To accommodate the R $\angle\theta$ signal from a limiter discriminator, the phase information ($\angle\theta$) is connected to the I channel input, and the amplitude information (R) is connected to the positive differential Q channel input, with an output of the AGC loop digital-to-analog converter (DAC) connected to the negative differential Q channel input. When R $\angle\theta$ modulation is used, the digital AGC loop, combined with the differential Q inputs, creates a high resolution A/D converter for R. The theta ($\angle\theta$) information is used for demodulation of the incoming bipolar modulated data, which may be either MSK or FSK modulated, if a limiter-discriminator or other FM demodulator is used.

BRIEF DESCRIPTION OF THE DRAWINGS

The exact nature of this invention, as well as the objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a baseband demodulator for both polar and rectangular modulated signals.

Figure 1:
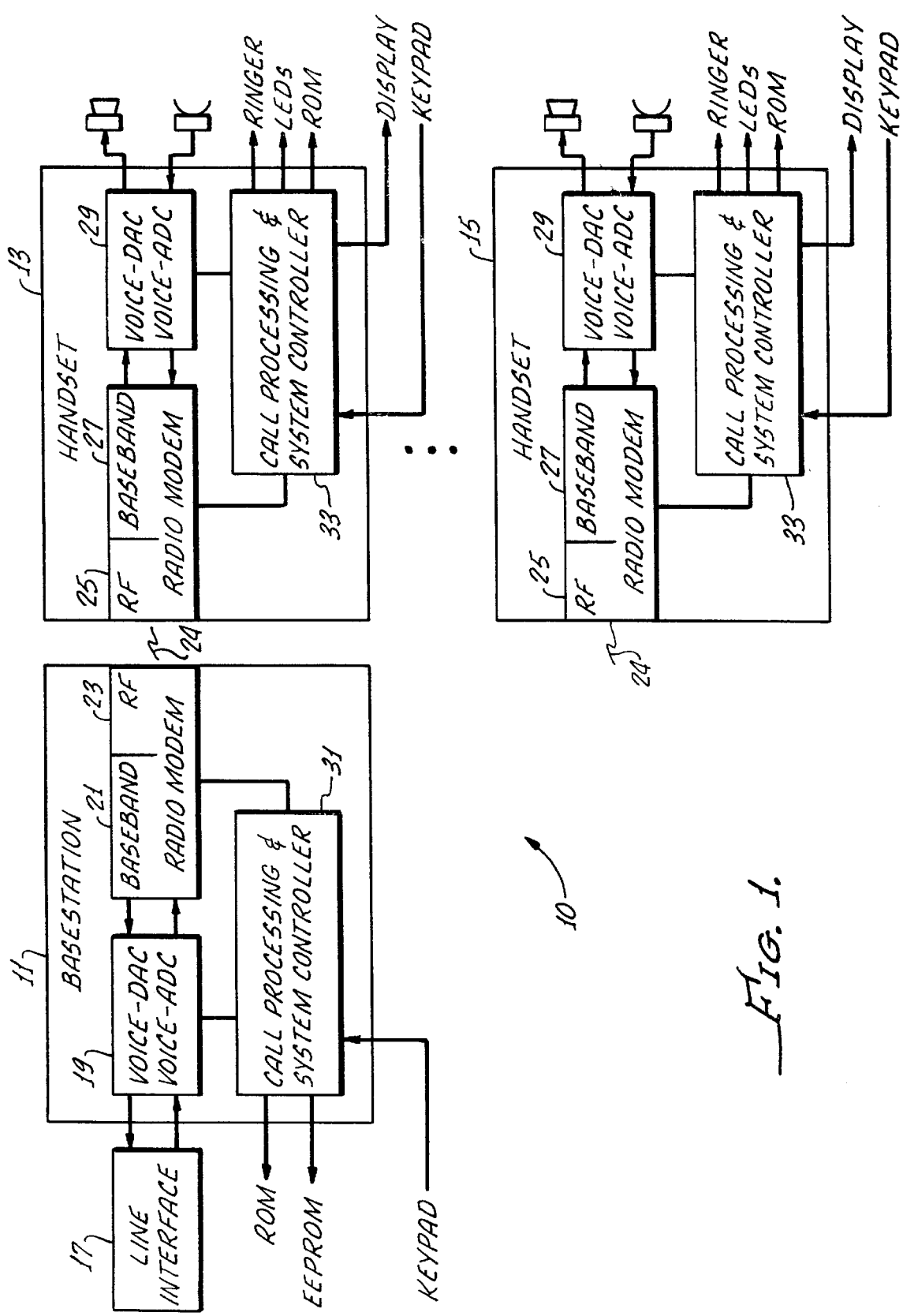
FIG. 1 is a block diagram of a spread spectrum telephone having more than one handset, and one base station which is connected to the public switched telephone network.

Referring to FIG. 1, the digital cordless telephone 10 having a plurality of handsets 13, 15 is designed to provide full duplex voice communication between handsets 13, 15 and the public switched telephone network (PSTN) (not shown) by way of an RF channel 24 through a base station 11 which is connected to the public switched telephone network by a line interface circuit 17.

Both the base station 11 and each of the handsets 13, 15 utilize a radio modem which is composed of a baseband modem 21, 27 in the base station 11 and both handsets 13, 15, respectively, and a radio frequency modem 23, 25 in the base station 11 and both handsets 13, 15, respectively. The radio modem transfers digital voice and control data between the handsets 13, 15 and the base station 11. Voice-to-digital and digital-to-voice converters 19 in the base station 11 and the handsets 13, is provide voice transport over the radio modem between the speaker and micro-phone and the handsets and the public switched telephone network. Each of the handsets 13, 15 and the base station 11 also has a system controller 33 for call processing and control functions. The system control unit 31 in the base station 11 and the controller 33 in the handsets 13, 15 function to provide the protocol for the radio modem in the base station and handsets to allow link establishment, maintenance, and power management. Telephone controls such as dial tones, ringing, keypad, and other call processing functions are also supported, as well as subsidiary functions such as displays, out-of-range alert, low battery alert, and signal quality alert.

The radio transmission and reception frequency band of the radio modem is in the lower ISM band (902–928 MHz). Operation in this band is governed by FCC Part No. 15.247 requirements and other Part 15 regulations.

Figure 2:
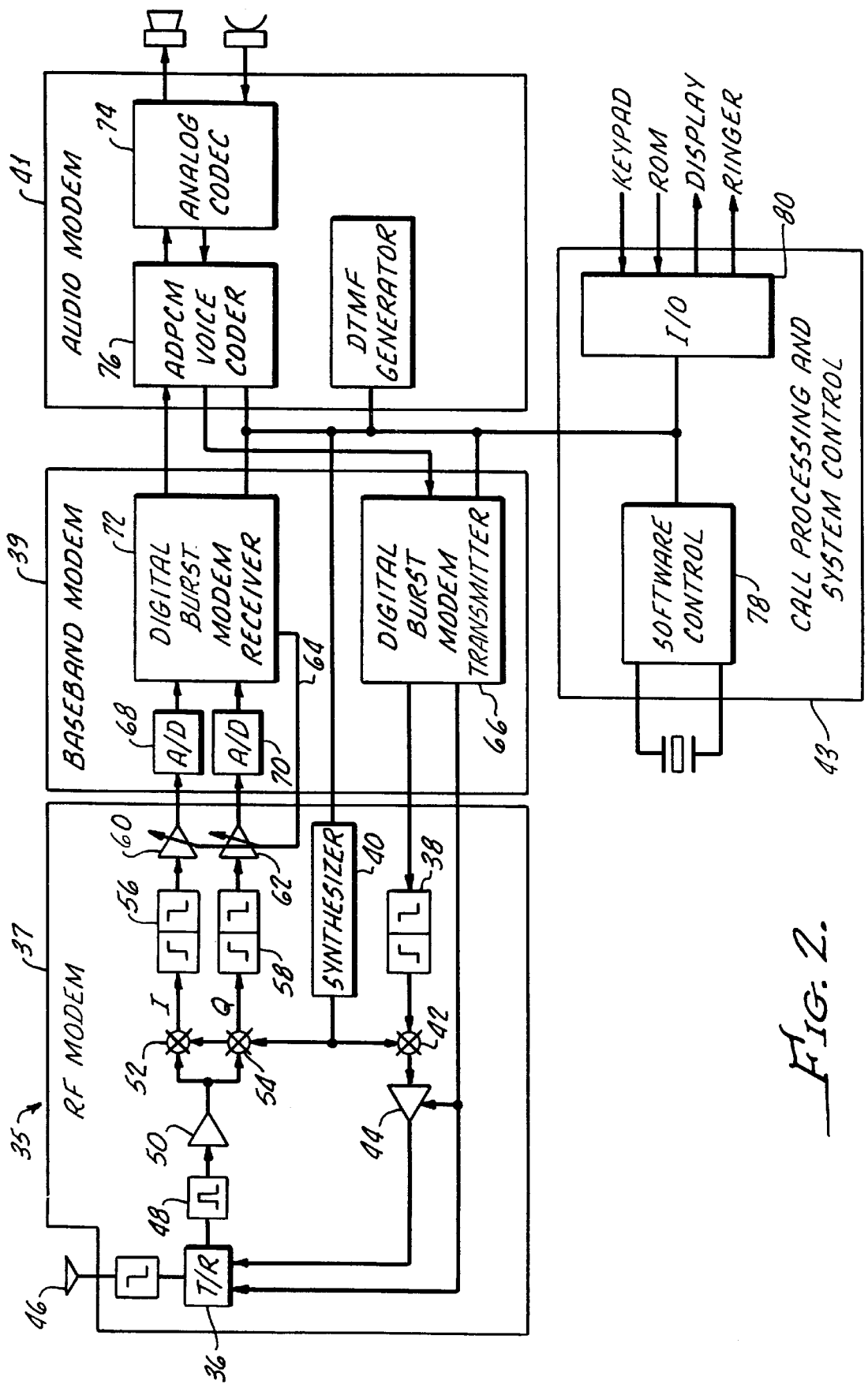
FIG. 2 is a block diagram of the modem configuration and controller found in both the handset and base station of the system of FIG. 1.

Referring now to FIG. 2, the modular construction of the base station and each handset is illustrated by the functional block diagram 35 which basically shows four functional blocks, an RF modem 37, a baseband modem 39, an audio modem 41, and a call processing and system controller 43. Each of these four functional blocks is substantially identical for each handset and each base station. The radio modem in the base station and handsets shown in FIG. 1 is partitioned into an RF modem and a baseband modem.

The RF modem 37 is a direct conversion transceiver. For transmit, analog, wave-shaped baseband data is modulated directly to the carrier frequency. For receive, the carrier is directly converted to analog, baseband, in-phase, and quadrature data signals. Because time division duplexing is utilized to channelize the transmit and receive data, TR switch 36 is used rather than a duplexer.

During the transmit phase, the RF modem 37 takes baseband data, high-pass filters it to remove any DC and then low-pass filters it to provide spectral shaping in filter unit 38. After filtering, the resultant signal modulates the synthesized RF carrier coming out of synthesizer 40 in modulator 42. The modulated signal is then amplified to one of the two or more transmit power levels by amplifier unit 44. The signal is then routed through TR switch 36 for transmission by antenna 46.

During reception, TR switch 36 selects the receive path from antenna 46. The received signal is filtered by a band-pass filter 48 to reject out-of-band signals. The filter signal is amplified by a low noise amplifier 50 and then enters a pair of mixers 52, 54, which convert the received signal to in-phase and quadrature baseband signals. Each baseband signal is high-pass and low-pass filtered, the in-phase signal in filter unit 56 and the quadrature phase signals in filter unit 58. The resultant in-phase and quadrature filtered signals are amplified in amplifiers 60, 62, respectively, by a programmable gain received from the baseband modem 39 over line 64 to bring the signals to the proper voltage levels.

The baseband modem 39 performs all the spread spectrum modulation and demodulation, data timing recovery, automatic frequency control estimation and correction, and AGC estimation, framing, and rate adaptation. During transmit, the baseband transmitter assembles a voice and supervisory data B frame and a link acquisition A frame. These frames are generated by an appropriate state machine under microprocessor control in digital burst modem transmitter 66. The data bits of the selected frames are differentially encoded and modulated with a spreading code in burst modem transmitter 66. After modulation, the nonreturn to zero (NRZ) signal is sent to the RF modem 37 for transmission.

During receive, the baseband modem 39 performs A/D conversion on the in-phase and quadrature baseband signals from the RF modem by A/D converters 68, 70, respectively. The A/D converted digital outputs are phase rotated and data demodulated in digital burst modem receiver 72.

The audio modem 41 comprises a CODEC 74 and audio engine 76. The CODEC 74 converts between a continuous amplitude, continuous time audio waveform, and an 8000 sample-per-second 13-bit digital representation. The audio engine or voice coder 76 implements a CCITT G721 ADPCM voice compression algorithm which converts between 32 kbps digital RF modem channel data and 8 kbps 13-bit linear voice.

The call processing and system controller 43 consists of a 6502 micro-controller 78 with an I/O 80, which supports all the system and call processing functions.

In the case of polar modulation, the RF modem 37 of FIG. 2 would be replaced by a limiter-discriminator receiver (not shown) of a type well known in the art. Suffice it to say, the output of the limiter-discriminator is R and $\angle\theta$, which is supplied to baseband modem 39 for demodulation, assuming that the data is FM modulated.

Figure 3:
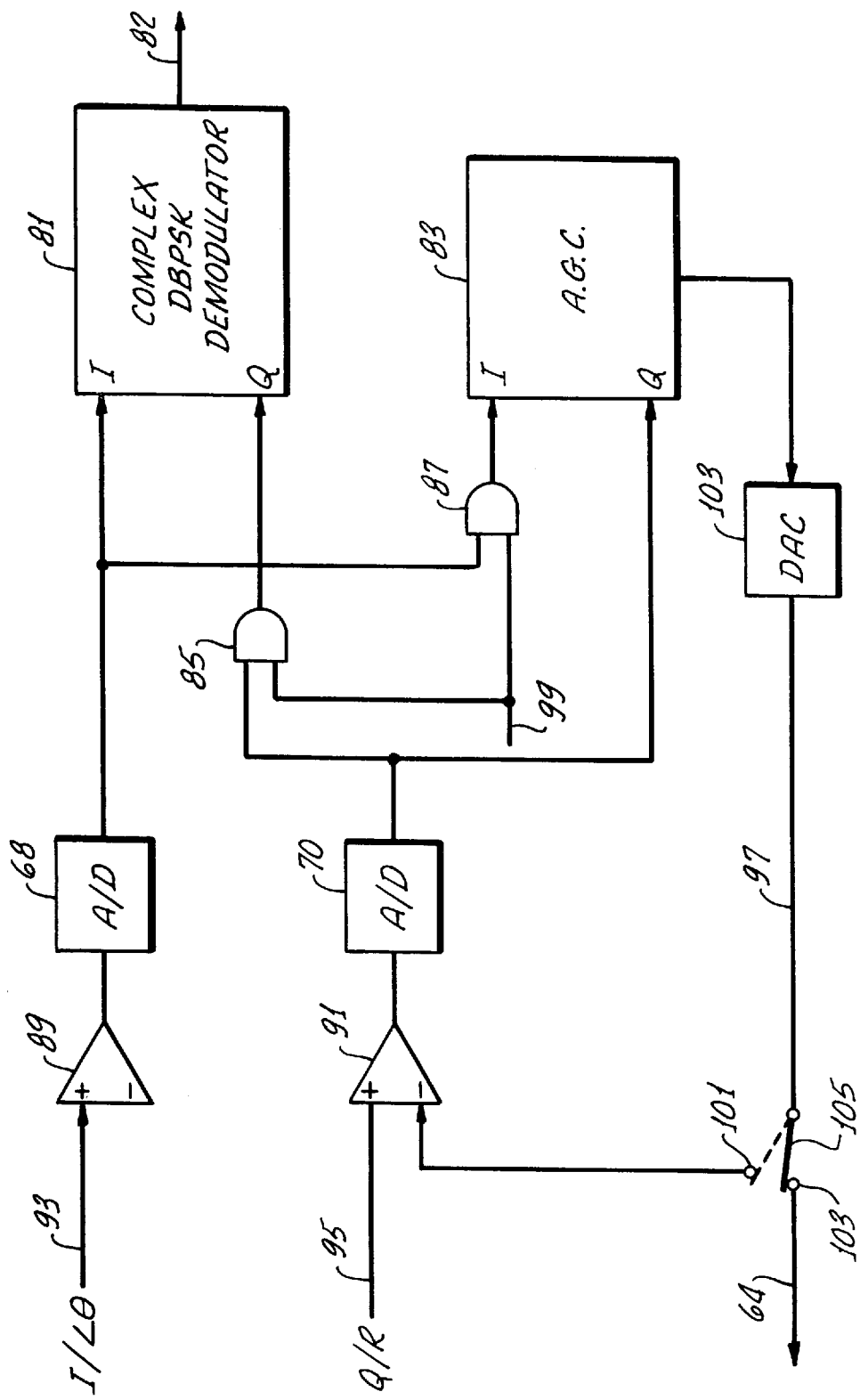
FIG. 3 is a block diagram of the demodulator portion of the baseband modem shown in FIG. 2.

The phase information ($\angle\theta$) is supplied on line 93 (FIG. 3) to the I channel input 89 of the differential binary phase shift keyed (DBPSK) demodulator 81. The $\angle\theta$ information is supplied to the I channel input of demodulator 81 by A/D converter 68. The amplitude information (R) is supplied on line 95 to the positive differential Q channel input 91 of the DBPSK demodulator 81 through A/D converter 70 and logic gate 85. The R information is made available to the demodulator 81 by connecting the output of DAC 103, which receives its signals from the automatic gain control circuit 83, to the negative differential Q channel input 91 of the DBPSK demodulator. The I channel input to the AGC logic 83 is set to zero by logic gate 87 as the result of a signal being applied to line 90. The R input is sent to the Q input of AGC logic 83 from A/D converter 70. A logic switch 108 effectively connects the output of DAC 103 on line 97 to the negative differential input 91 of the DBPSK demodulator when receiving R $\angle\theta$ by connecting to point 101 or connects it to the feedback line 64 by connecting to point 103.

Thus, when R $\angle\theta$ signals are received, the digital AGC logic 83, with the differential Q inputs, provides a high resolution A/D conversion for R. The $\angle\theta$ information received at the differential I input is used to demodulate the incoming data to provide output data on line 82.

When I and Q data is being received from RF modem 37, logic switch 105 is set to connect the DAC 103 output to point 103 for feedback to the RF modem on line 64. I data received on line 93 is sent by A/D converter 68 to the I input of DBPSK demodulator 82. Q data received on line 95 is sent to the Q input by A/D converter 70 through logic gate 85. The AGC logic 83 also gets the I data at its I input through logic gate 87 and the Q data at its Q input from A/D converter 70.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. In a spread spectrum communication link, a baseband demodulator connected to receive in-phase and quadrature baseband signals and amplitude and phase angle baseband signals, the baseband demodulator comprising:

a digital AGC logic circuit having an output connected to a DAC;

means for connecting the output of the DAC to a differential Q input of the baseband demodulator when amplitude and phase angle signals are being received;

means for connecting the amplitude components of a received signal to a differential Q input of the baseband demodulator; and means for connecting the phase angle components of the received signal to the differential I input of a baseband demodulator.

2. The baseband demodulator of claim 1 further comprising:

means for connecting the amplitude components of the received signal to a Q input of the AGC logic circuit.

3. The baseband demodulator of claim 2 further comprising:

means for connecting the output of the DAC to a feedback loop for a radio frequency demodulator when I and Q signals are being received.

4. The baseband demodulator of claim 3 further comprising:

means for connecting received I channel signals to said differential I input of the baseband demodulator; and means for connecting received Q channel signals to said differential Q input of the baseband demodulator.

5. The baseband demodulator of claim 4 further comprising:

means for connecting received I channel signals to an I input of the AGC logic circuit; and means for connecting received Q channel signals to the Q input of the AGC logic circuit.

6. In a cordless telephone having a base station connectable to a switched telephone network and at least one handset, said base station and handset communicating over a radio frequency link utilizing spread spectrum modulation, a baseband demodulator in said handset and in said base station, each connected to receive RF demodulated signals in either polar or rectangular form, received over the radio frequency link, the baseband demodulator comprising:

a digital AGC logic circuit having an output connected to a DAC;

means for connecting the output of the DAC to a differential Q input of the baseband demodulator when amplitude and phase angle signals are being received;

means for connecting the amplitude components of the received signal to a differential Q input of the baseband demodulator; and means for connecting the phase angle components of the received signal to a differential I input of the baseband demodulator.

7. The cordless telephone of claim 6 further comprising:

means for connecting the amplitude components of the received signal to the Q input of a AGC logic circuit.

8. The cordless telephone of claim 7 further comprising:

means for connecting the output of the DAC to a feedback loop for a radio frequency demodulator when I and Q signals are being received.

9. The cordless telephone of claim 8 further comprising:

means for connecting received I channel signals to said differential I input of the baseband demodulator; and means for connecting received Q channel signals to said differential Q input of the baseband demodulator.

10. The cordless telephone of claim 9 further comprising:

means for connecting received I channel signals to an I input of the AGC logic circuit; and means for connecting received Q channel signals to the Q input of the AGC logic circuit.

* * * * *